Figure 1A:
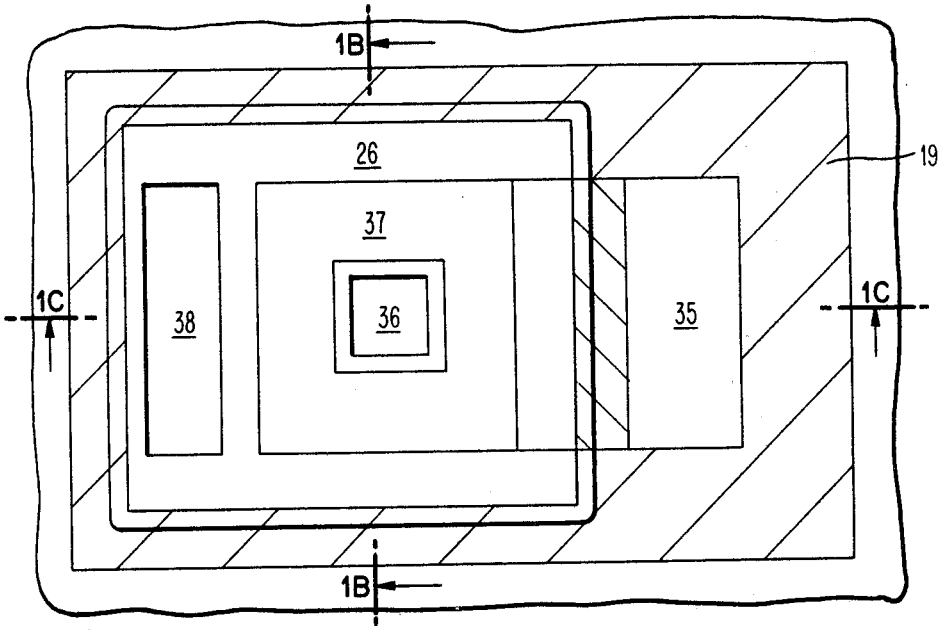
Figure 1C:
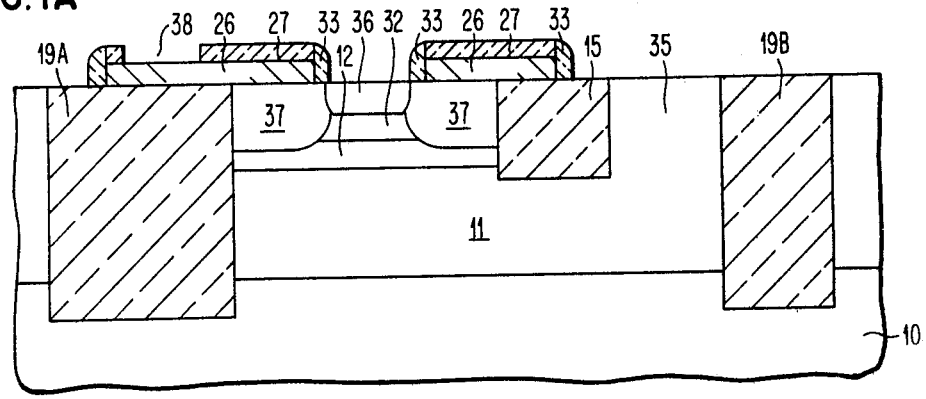
Figure 1B:
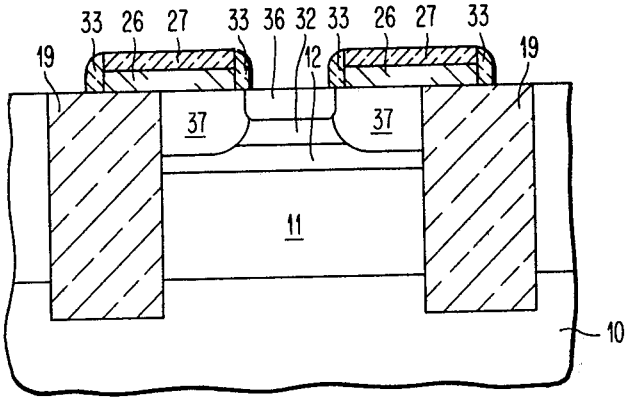
Figure 2:
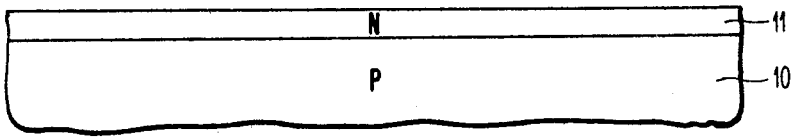
Figure 3:
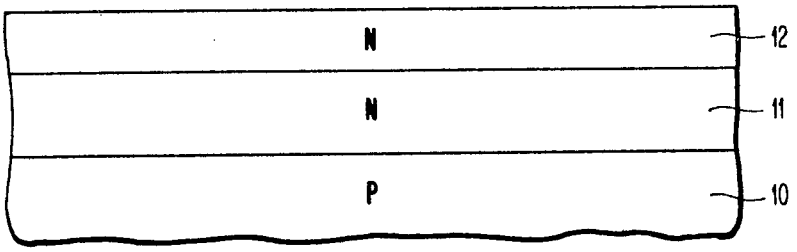
Figure 4:
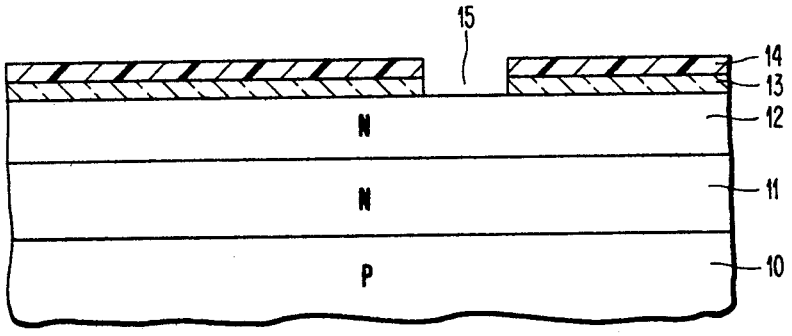
Figure 5:
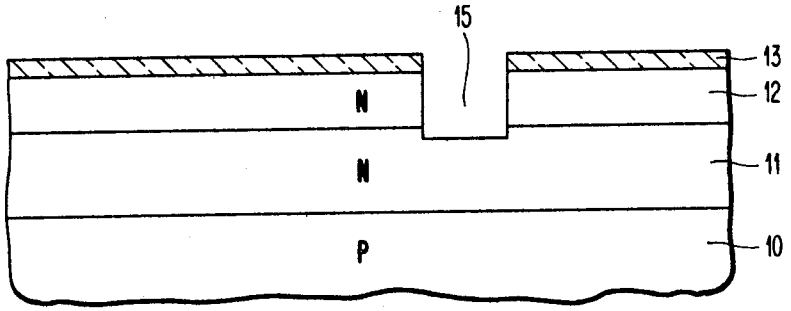
Figure 6:
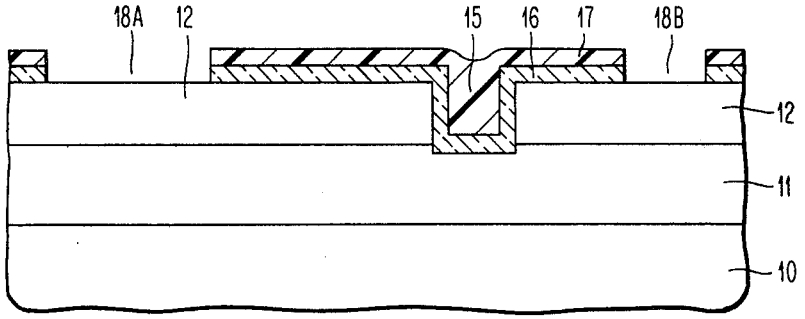
Figure 7:
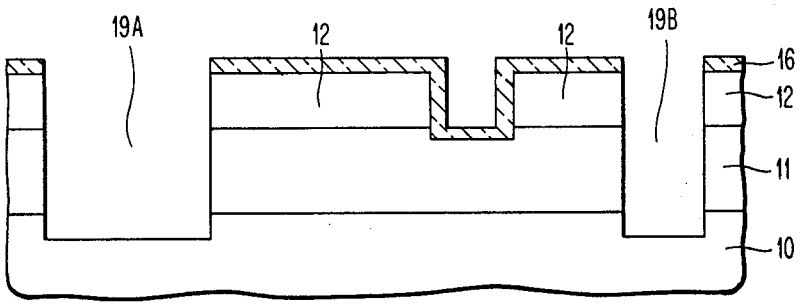
Figure 8:
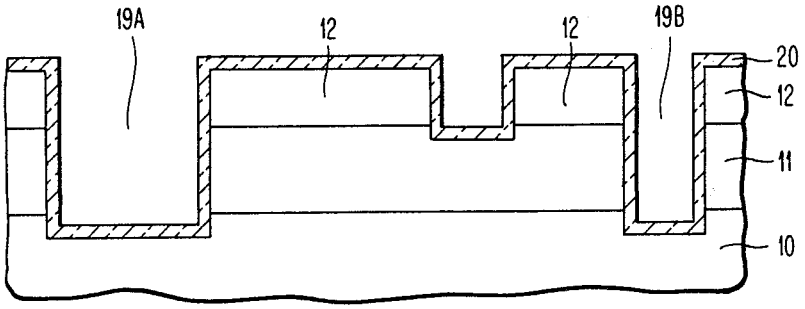
Figure 9:
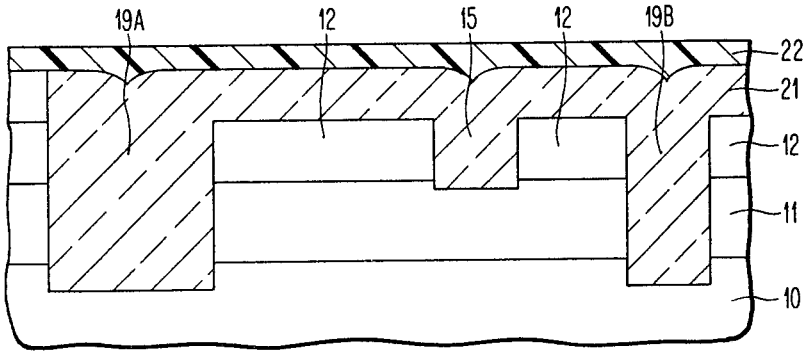
Figure 10:
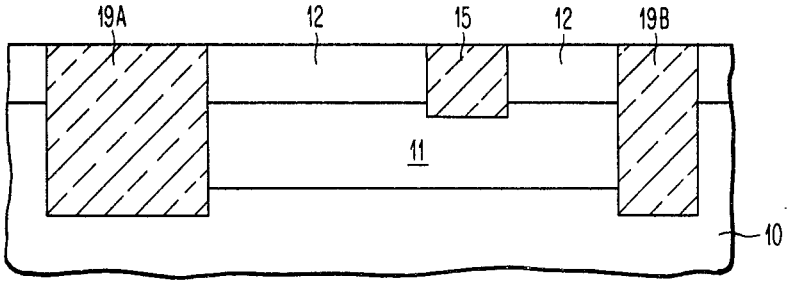
Figure 11:
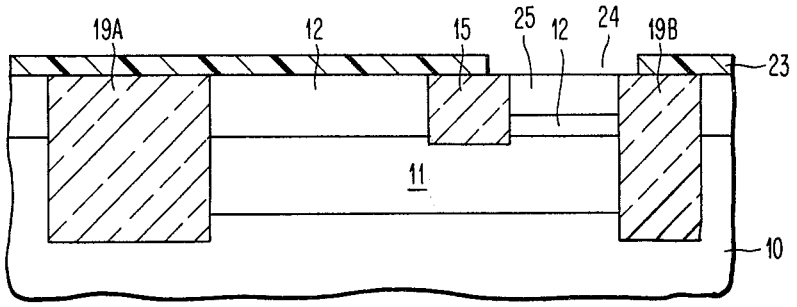
Figure 12:
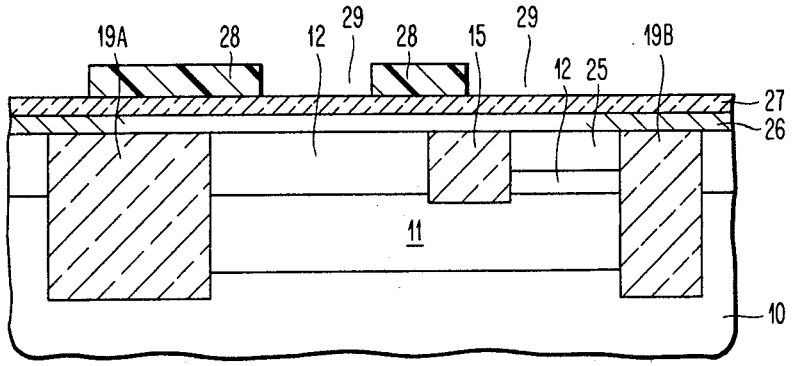
Figure 13:
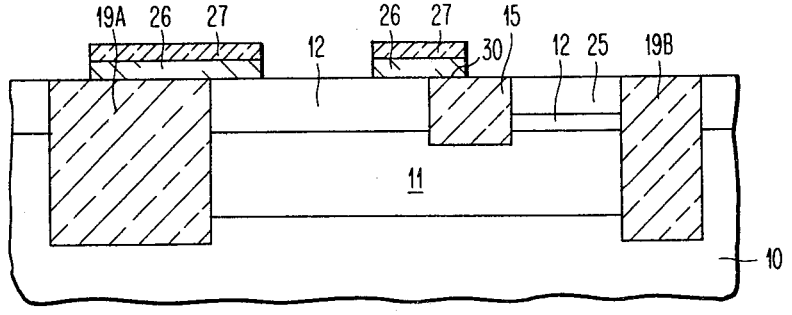
Figure 14:
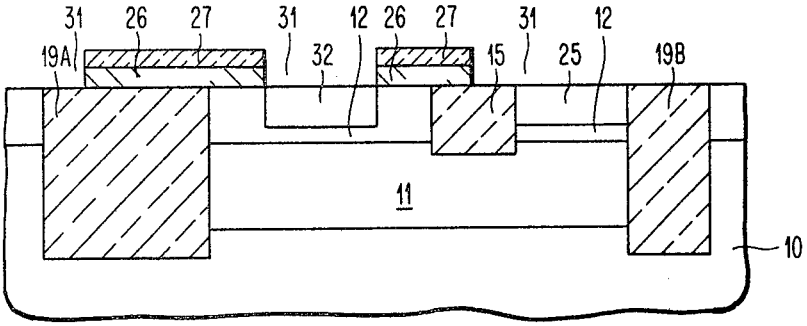
Figure 15:
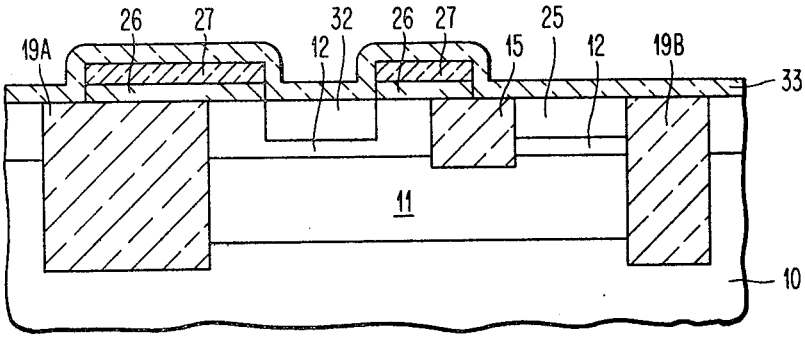
Figure 16:
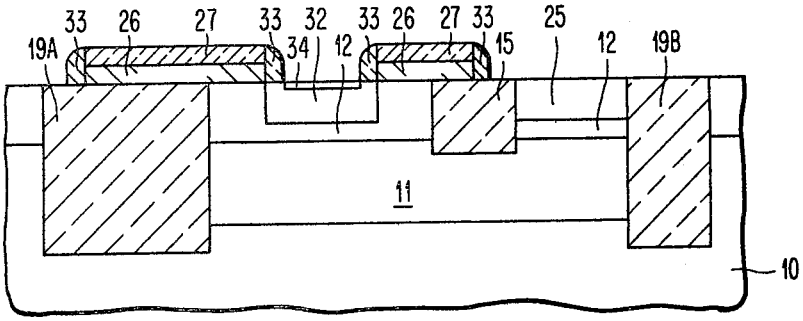
Figure 17:
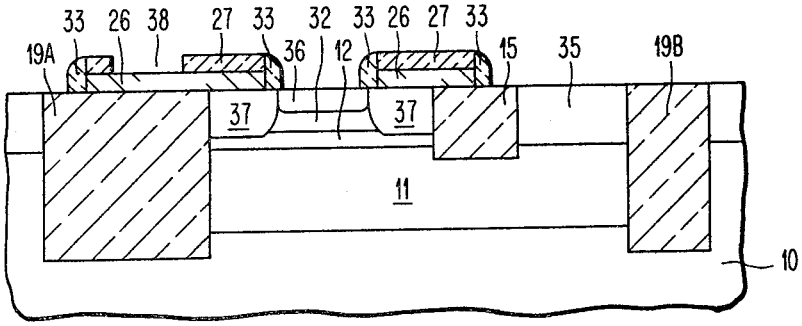

United States Defensive Publication [19] (H) [11] T104,102

Ho et al. [43] Apr. 3, 1984

[54] POLYSILICON-BASE SELF-ALIGNED BIPOLAR TRANSISTOR PROCESS AND STRUCTURE

[76] Inventors: Allen P. Ho, 2 High Point Dr., Poughkeepsie, N.Y. 12603; Cheng T. Horng, 6396 Gondola Way, San Jose, Calif. 95120

[21] Appl. No.: 370,897

[22] Filed: Apr. 22, 1982

Related U.S. Application Data

[63] Continuation of Ser. No. 133,155, Mar. 24, 1980, abandoned.

[51] Int. Cl.[3] ..... H01L 27/04

[52] U.S. Cl. ..... 357/50; 357/34; 357/59

[57] ABSTRACT

A bipolar transistor isolated by deep recessed oxide 19, with shallow recessed oxide 15 separating the base 32, 37 from collector contact 35, with polysilicon contact 26 to base extrinsic region 37, the polysilicon being self-aligned with the emitter 36 and the emitter contact.

2 Claims, 5 Sheets Drawing,

33 Pages Specification

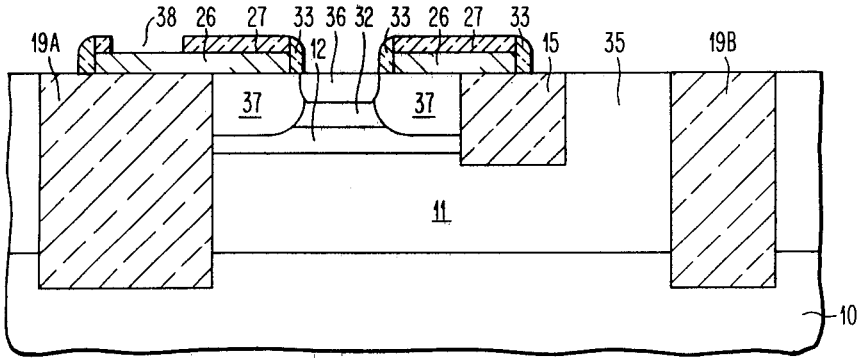

The file of this unexamined application may be inspected and copies thereof may be purchased (849 O.G. 1221, Apr. 9, 1968).